United States Patent [19]
Timmer et al.

[11] Patent Number: 5,846,665
[45] Date of Patent: Dec. 8, 1998

[54] METHOD FOR ELECTROPLATING HIGH-IMPACT PLASTICS

[75] Inventors: Roger James Timmer; Lee Alan Chase, both of Ada, Mich.

[73] Assignee: Lacks Industries, Inc., Grand Rapids, Mich.

[21] Appl. No.: 417,456

[22] Filed: Apr. 5, 1995

Related U.S. Application Data

[63] Continuation of Ser. No. 206,027, Mar. 3, 1994, abandoned, which is a continuation of Ser. No. 926,558, Aug. 6, 1992, abandoned, which is a continuation of Ser. No. 617,497, Nov. 23, 1990, abandoned.

[51] Int. Cl.$^6$ ....................................................... C25D 5/56
[52] U.S. Cl. ......................... 428/626; 205/50; 205/167; 205/169; 205/924; 205/928; 428/935
[58] Field of Search .............................. 205/50, 167, 169, 205/924, 928; 428/626, 935

[56] References Cited

U.S. PATENT DOCUMENTS

| | | | |
|---|---|---|---|
| 3,822,835 | 7/1974 | Shore | 242/55.19 A |
| 4,125,649 | 11/1978 | Donovan | 427/307 |
| 4,610,895 | 9/1986 | Tubergen et al. | 427/98 |
| 4,770,751 | 9/1988 | Kawagishi et al. | 204/30 |
| 5,015,329 | 5/1991 | Patel et al. | 156/628 |

OTHER PUBLICATIONS

Handbook of Chemistry and Physics, 57th edition, Robert C. Weast, editor, CRC Press, Cleveland, 1976*, p. C–460.

Shipley product data sheet EMC–1521, 1987*, p. 1.

*Primary Examiner*—Kathryn L. Gorgos
*Assistant Examiner*—William T. Leader
*Attorney, Agent, or Firm*—Vanophem Meehan & Vanophem, P.C.

[57] ABSTRACT

A method for plating a high impact resistant plastic, particularly a polycarbonate substrate which has been modified with up to about 50 percent by weight of acrylonitrile-butadiene-styrene. The surface of the plastic is first conditioned with a halogenated organic solvent conditioner, preferably 1-3-dichloro-2-propanol, prior to electroless plating and the electrochemical deposition of the desired metal layer.

5 Claims, No Drawings

METHOD FOR ELECTROPLATING HIGH-IMPACT PLASTICS

This application is a continuation of Ser. No. 08/206,027, filed on Mar. 3, 1994, now abandoned, which is a continuation of Ser. No. 07/926,558, filed on Aug. 6, 1992, now abandoned, which is a continuation of Ser. No. 07/617,497, filed on Nov. 23, 1990, now abandoned.

BACKGROUND OF THE INVENTION

1. Field of the Invention

The present invention generally relates to methods for electroplating a metal onto a plastic substrate. More particularly, this invention relates to a method for electroplating plastics having a high impact resistance wherein the plastic substrate is a polycarbonate which has been modified with up to about 50 percent of an acrylonitrile-butadiene-styrene polymer.

2. Description of the Prior Art

Motor vehicles often include substantial amounts of chrome plated trim elements which provide both decorative and functional purposes. Such trim elements include bumpers, body side moldings, lower body claddings, wheel covers and grilles as well as other components. The overall appearance of the vehicle is significantly enhanced by these highly reflective and glistening chrome surfaces. However, these trim elements also serve a functional purpose in that they help to absorb the impact when the vehicle is involved in a collision or when the vehicle contacts flying gravel, road debris, roadway abutments or the like.

Traditionally these trim elements have been manufactured from materials which are capable of absorbing such an impact, examples being chrome plated steel, anodized aluminum, and stainless steel. These traditional trim elements not only add significantly to the cost of the vehicle, but substantially increase the vehicle weight thereby decreasing the fuel economy rating for the vehicle.

Therefore, there has been great efforts by the automotive industry toward developing a cost effective, lightweight alternative to these chrome plated metals. Plateable plastics are such a desirable alternative, because they not only reduce the vehicle weight and thereby correspondingly increase the vehicle fuel economy, but plateable plastics also allow for parts consolidation within the automobile. Plastics have much greater design flexibility than metals. Plastics may be easily molded into a limitless variety of complex and contoured configurations which cannot be achieved with conventional metal stamping and forming operations. In addition, when these parts are formed from plastic materials, a significant cost savings is realized over comparable parts formed from metal.

A wide variety of plated plastics are known. For example, unmodified acrylonitrile-butadiene-styrene (ABS) has been plated to provide decorative articles such as headlamp surrounds, and plumbing and marine hardware. Unmodified polycarbonate (PC) has been utilized as the substrate for plated motor vehicle door handles. In addition, several other plastics have been successfully plated for various decorative purposes. However, these plastics, even though plateable for decorative purposes, do not provide a satisfactory substrate if the finished article must be capable of sustaining significant impact. Accordingly, the use of these materials within an automobile is limited. These plated plastics are characterized by a tendency to fail at low energy levels of impact. Regardless of the substrate utilized, upon impact the chrome plating typically delaminates from the substrate. In addition, as an extreme example, the unmodified ABS may even shatter upon impact.

Thus, for a plastic to be suitable as a substrate in a plated article within an automobile, it must generally have sufficient impact resistance. Further, its impact resistance must be good over a wide range of temperatures. Attempts to develop an impact-resistant plastic have resulted in the formulation of many blends, including acrylonitrile-butadiene-styrene polycarbonates which will be referred to throughout as ABS-modified polycarbonate polymers. When the ABS material is compounded with the polycarbonate, the result is a material characterized by a good balance of heat resistance and impact properties over a wide range of temperatures, all at an intermediate cost.

However, until this invention, commercial efforts to plate an ABS-modified polycarbonate substrate have been unsuccessful. To the extent that the metal plating can even be deposited onto the ABS-modified polycarbonate material, there is little or no adhesion to the substrate. Therefore, upon impact, the metal plate chips, cracks, fractures and delaminates.

Methods have been taught by the art to improve adhesion between the metal plate and a plastic substrate. In particular, U.S. Pat. No. 4,125,649 to Donovan et al, entitled "Pre-etch Conditioning of Polysulfone and other Polymers for Electroless Plating" teaches one method for conditioning the surface of various polymer substrates to enhance adhesion of subsequently deposited metals to that surface, including unmodified ABS material and unmodified polycarbonate material. Donovan et al successfully condition the various polymer substrates using a halogenated alcohol, 1-3-dichloro-2-propanol, and then plate onto the substrates with satisfactory levels of adhesion resulting.

However, the time, temperature and concentration of the organic solvent conditioner were optimized by Donovan et al to generally provide a high activity, very aggressive conditioner. With regard to the unmodified polycarbonate, it is necessary to micro-crack and roughen the unmodified polycarbonate so as to provide a suitable plating surface. It has been determined that conditioning an ABS-modified polycarbonate substrate with the type of highly aggressive conditioning treatment taught by the method of Donovan et al, would be detrimental and undesirable because the conditioner overly reacts with the ABS-modified polycarbonate substrate, thereby damaging the surface finish of this type of substrate and making it unacceptable for subsequent plating.

Donovan et al are thorough in their exhaustive list of polymer materials which may be conditioned using their method to enhance adhesion of the metal plate on a plastic substrate, yet the high impact resistance ABS-modified polycarbonate material is noticeably absent from their teachings. This is typical of the art, since there has been no satisfactory method, as of yet, to effectively plate this high impact resistant material so as to result in a high level of adhesion between the metal plate and the plastic to prevent delamination upon impact.

It is to be noted that other impact-resistant polymeric blends, such as nylon-polycarbonate blends, unblended polyurethane, and butadiene-loaded ABS have been plated. However, these materials exhibited unsatisfactory results when plated because of their poor cosmetic appearance and failure to withstand impact without delamination. Therefore, these materials are also unsuitable for high impact plated plastic applications.

Accordingly, what is needed is a method for electroplating metal to a high impact plastic, particularly an ABS-modified polycarbonate substrate, wherein the resulting product is characterized by excellent adhesion between the metal plate and the ABS-modified polycarbonate substrate.

SUMMARY OF THE INVENTION

It is the principal object of this invention to provide a method for electroplating metal to an ABS-modified polycarbonate substrate.

It is a further object of this invention that the plated article formed according to such a method be characterized by good adhesion between the metal plate and the plastic substrate so as to withstand an impact without delamination of the metal plate from the substrate.

In accordance with a preferred embodiment of this invention, these and other objects and advantages are accomplished as follows.

According to the present invention, there is a method for electroplating a polycarbonate substrate which has been modified with acrylonitrile-butadiene-styrene or ABS, wherein the surface of the substrate is first treated with an organic solvent conditioner and next treated with an appropriate acid to prepare the substrate surface for metal plating. Subsequently, an extremely thin layer of metal, commonly referred to as a metal strike, is electrolessly applied to the treated surface and then the desired metal plate is electrochemically deposited onto the metal strike.

The ABS-modified polycarbonate material is characterized by high impact resistance and relatively high strength. The proportion of ABS to polycarbonate in the polymer blend can vary over a relatively wide range. Preferably, the portion of ABS in the blend is no more than about 50 percent by weight with about 15 to about 40 percent by weight being most preferred.

The halogenated hydrocarbon solvent conditioner is one which effectively pretreats the surface by exposing the ABS and increasing the amount of ABS available for the subsequent acid etch. The halogenated solvent conditioner may be used in various aqueous concentrations. It is preferably chlorinated and selected from the group consisting of alcohols, ketones and ethers. The preferred halogenated hydrocarbon solvent conditioner is 1-3-dichloro-2-propanol.

The plastic substrate may be dipped in a bath of the halogenated solvent conditioner for a time and temperature sufficient to effectively treat the surface and increase the amount of exposed ABS. The chlorinated solvent conditioner is preferably used in a concentration of about 5 to about 25 percent by volume in an aqueous medium. The time and temperature of the treatment may vary over a wide range depending on the nature of the solvent, the concentration of the solvent, and the temperature of the medium, in order to expose the ABS within the surface of the plastic article. In the preferred embodiment wherein a 8 to 12 percent by volume concentration of 1-3-dichloro-2-propanol is used in an aqueous medium, the temperature is approximately 95° F., and the plastic article is treated for no longer than about 4 minutes.

The acid used in the process may be any one of a number of conventional acids used in the pretreatment of plastics prior to plating and which are effective to etch the butadiene within the surface of the ABS-modified polycarbonate plastic article. A chromic-sulfuric acid has been found especially suitable for the method according to this invention.

The acid is typically present within a bath in which the ABS-modified polycarbonate plastic article is dipped. The time of the acid treatment and the temperature of the bath may vary over a wide range depending on the concentration of the acid in the bath, the nature of the acid, and the particular composition of the ABS-modified polycarbonate plastic. The acid concentration, time and temperature are selected to effectively etch and roughen the surface of the plastic article to make it suitable for plating. In a preferred embodiment of this invention employing a chromic-sulfuric acid bath at a temperature of about 160° F., the ABS-modified polycarbonate article is treated in the bath for about 2 to 8 minutes.

Preferably the ABS-modified polycarbonate article is rinsed in tap or deionized water between each step.

In addition, in the preferred embodiment of this invention, the ABS-modified polycarbonate article is finish electroplated with chromium. This is accomplished by first electrolessly depositing a layer of metal strike onto the substrate, and then electrochemically depositing the chromium onto the metal strike layer. Palladium is used to catalyze the electroplating of the chromium to the ABS-modified polycarbonate substrate.

An inventive feature of this invention is that according to the method of this invention, there is formed an electroplated high impact resistant ABS-modified polycarbonate article which is characterized by having exceptional adhesion between the electroplated metal and the ABS-modified polycarbonate substrate. Even upon impact, the metal plating adheres well to the ABS-modified polycarbonate substrate without chipping, cracking or delamination. Prior to the method of this invention, there has been no suitable method for plating the ABS-modified polycarbonate material.

Other objects and advantages of this invention will be better appreciated from the following detailed description.

DETAILED DESCRIPTION OF THE PREFERRED EMBODIMENT

This invention provides a method for forming an electroplated ABS-modified polycarbonate article suitable for use in applications which require good impact resistance such as in automotive component applications. The adhesion between the ABS-modified polycarbonate substrate and the electroplated metal is exceptional such that upon impact, the metal plating adheres well without chipping, cracking or delamination from the substrate.

In general, the method consists of the steps of chemically pretreating or conditioning the ABS-modified polycarbonate substrate, etching the treated substrate with an acidic solution, electrolessly plating a layer of metal strike and finally electrochemically depositing the desired metal plate on to the metal strike.

The preferred substrate for use with this method is a polycarbonate which has been modified with up to about 50 percent by weight of acrylonitrile-butadiene-styrene. Preferably, the amount of ABS ranges between about 15 to about 40 percent by weight, depending on the intended application for the finished article. An ABS-modified polycarbonate substrate having about 40 percent ABS by weight and having the physical characteristics described in Table I would be suitable for high impact resistance automotive applications.

TABLE I

|  | Temperature (°F.) | Total Energy Absorbed (inch-pounds) |
|---|---|---|
| Instrumented Dart | 73 | 500 (minimum) |
| Impact Test[1] | −23 | 500 (minimum) |
| Izod Impact | 73 | 12 (minimum) |
| Strength[2] | −23 | 10 (minimum) |
| % Elongation at Break[3] | 100% | (minimum) |

[1]ASTM Test Method D-3763. Plaque thickness = 0.125"; rate = 8,000 inches/minute; dart diameter = 0.5".
[2]ASTM Test Method D-256. Plaque thickness = 0.125"; notch size = 10 mm.
[3]ASTM Test Method D-638.

The ABS-modified polycarbonate substrate is first chemically pretreated to prepare or condition it for subsequent electroplating. The plastic substrate is treated with an organic solvent-based conditioner that exposes the ABS component of the ABS/polycarbonate blend. It is believed that the conditioner softens and swells the substrate surface so as to effectively increase the amount of ABS exposed to the subsequent etching bath. This is necessary to provide a suitable surface for subsequent electrochemical plating.

The conditioner has the general formulation of a halogenated alcohol, halogenated ether or halogenated ketone. More specifically, a conditioner having the formulation of a chlorinated alcohol, chlorinated ether or chlorinated ketone is preferred, with 1-3-dichloro-2-propanol being the most preferred. The conditioner is preferably diluted with water or other aqueous media to a concentration of about 5 to about 25 percent by of conditioner, with about 10 to 12 volume percent by volume being most preferred. Surfactants or alcohols may be added to the conditioner to increase its solubility in water.

The ABS-modified polycarbonate substrate is immersed in a bath of the conditioner maintained at a preferable temperature of approximately 95° F., certainly no higher than about 120° F., for up to about 2 minutes, preferably at least about 1 minute to ensure complete surface conditioning. As the concentration of the conditioner is increased, the immersion time may be shortened within this range and/or the temperature of the conditioner bath may be reduced while still achieving satisfactory results. The temperature of about 95° F. is preferred with a concentration of about 12 percent by volume of the 1-3-dichloro-2-propanol, since these parameters allow a more controlled conditioning of the surface. At higher temperatures or concentrations, the conditioning may occur too rapidly and degradation of the substrate surface may result.

It is to be noted that the prior art has generally taught against the use of solvent conditioners for plating ABS unless it is necessary to expose additional butadiene as when the substrate molding operation fails to uniformly disperse the butadiene throughout the substrate. Even in those cases, the conditioner typically employed is 2–4 pentadione, butyl lactone, or other ketone.

Following immersion in the conditioner bath, the ABS-modified polycarbonate substrate is preferably rinsed with either tap or deionized water to remove residual traces of the conditioner.

The substrate is further pretreated by exposing it to a conventional chromic acid-sulfuric acid etching bath maintained at approximately 140° F.–180° F. for a duration of up to about 10 minutes. The preferred etching bath temperature is about 160° F. at which the conditioned substrate is immersed for approximately 2 to 8 minutes. A conventional etching bath may be provided by diluting concentrated sulfuric acid to provide a solution having a normality in the preferred range of about 10.5 to about 11.0 and then adding to each gallon of the sulfuric acid about 3.5 to about 4 pounds of the chromic acid. As the concentration of the acid bath is varied, the temperature of the bath and duration of the exposure may be appropriately varied as within the conventional teachings of the art. Again, the above preferred parameters result in an optimized etching treatment of the ABS-modified polycarbonate substrate.

It is believed that the hexavalent chromium ions within the acid bath etch away the butadiene from the surface of the ABS-modified polycarbonate substrate, thereby roughening the surface of the substrate and increasing the amount of surface area available to the metal-plating. This promotes better adhesion of the subsequent metal plating. If too little butadiene is etched, there is insufficient roughening to adequately adhere the plating to the substrate. Contrarily, if too much butadiene is etched away, the surface of the substrate is marred and the finished plated article will not have a commercially acceptable appearance. Thus, it is apparent that the organic solvent conditioner used in the previous step of this method to increase the amount of exposed ABS at the surface of the substrate is extremely important.

Once so treated, the ABS-modified polycarbonate substrate is rinsed and readied for plating. As an example, the substrate may be electrolessly plated with a suitable first metal strike of copper or nickel, and then subsequently electrochemically plated with a chromium finish. Preferably, the plating is carried out using standard plating cycles for ABS material wherein palladium is used to catalyze the plating in a concentration range of about 20 to about 50 parts per million.

The chrome plated ABS-modified polycarbonate substrate formed according to this method has excellent resistance to impact and exhibits exceptionally high adhesion between the metal plate and ABS-modified polycarbonate substrate. Impact resistance when tested by a gravelometer and a Gardiner impact test is superior to that of unblended, conventionally plated ABS material, plated mineral reinforced nylon, or a polycarbonate-modified ABS material wherein the polycarbonate component is less than about 50 weight percent.

As shown in Table II, four plaques each measuring approximately 4"×4"×0.125" were subjected to a dart impact test conducted in accordance with ASTM test method D-3763 at a temperature of approximately −20° F. When a support having a 3" diameter and a dart having a diameter of approximately 0.5" were employed at a test rate of about 5280 inches/minute (or approximately 5 miles/hour), the plaque formed of an ABS-modified polycarbonate substrate in accordance with this invention exhibited a total energy absorption substantially in excess of the plaques formed of the other high impact resistance materials, i.e., the conventionally plated ABS, plated mineral reinforced nylon, and plated polycarbonate-modified ABS.

TABLE II

| Plaque Material | Total Energy Absorbed (inch-pounds) |
|---|---|
| Conventionally plated ABS | 12.0 |
| Plated mineral reinforced nylon | 11.0 |
| Plated Polycarbonate-modified ABS (<50% polycarbonate) | 14.0 |

TABLE II-continued

| Plaque Material | Total Energy Absorbed (inch-pounds) |
| --- | --- |
| Plated ABS-modified Polycarbonate having less than 40% ABS in accordance with this invention | 144.0 |

Similarly, as shown in Table III, metal plate to substrate adhesion was evaluated using a peel test carried out in accordance with ASTM test method B-533. The various substrates were plated with copper metal. The performance of the ABS-modified polycarbonate substrate plated in accordance with this inventive method exhibited levels of adhesion comparable to other plastic substrates that have been successfully, commercially plated such as ABS and mineral reinforced nylon.

TABLE III

| Test Material | Peel Strength (pounds) |
| --- | --- |
| Conventionally plated ABS | >4 |
| Plated Mineral Reinforced Nylon | 2 |
| Plated ABS-modified Polycarbonate formed in accordance with the method of this invention | >4 |

A significant aspect of the mthod of this invention is the attainment of adhesion levels comparable to other commercially successful plateable plastics but utilizing a plastic that is impact resistant. As shown above, the ABS-modified polycarbonate material is characterized by adhesion at least at the levels of these other plateable plastics, yet the unmodified ABS material and the mineral reinforced nylon tend to shatter upon impact. Therefore, even though plateable, these materials are unsuitable for use within finished articles that must be impact resistant. Previous to the method of this invention, attempts to plate an ABS-modified polycarbonate have been commercially unsuccessful.

The impact resistance demonstrated by articles formed according to the method of this invention is similar to the resistance offered by plated stainless steel used in automotive trim as an example, when compared in a gravelometer test. However, articles produced according to this method offer significant advantages over plated stainless steel because they are lighter in weight and allow significantly more design flexibility all at a lower cost. The ABS-modified polycarbonate substrate of this invention may be easily molded into far more complex configurations than is possible when stamping stainless steel.

A specific example of the method of this invention for producing a plated ABS-modified polycarbonate plastic article characterized by high impact resistance and good adhesion is as follows.

EXAMPLE 1

The article to be plated, for example an automotive trim element, formed of an ABS-modified polycarbonate plastic blend having about 15 to 40 percent by weight of the ABS component is conditioned using the following step, to increase the amount of the butadiene component of the ABS that is exposed at the surface of the article. The ABS-modified polycarbonate article is immersed in a conditioning bath consisting of 1-3-dichloro-2-propanol diluted to about 10 to 12 percent by volume of the conditioner in water. Surfactants are conventionally mixed with the chlorinated solvent in an amount effective to solubilize the organic conditioner. The bath is maintained at approximately 95° F. to treat the article for about 0.5 to about 4 minutes. The article is then rinsed in tap or deionized water to remove residual traces of the conditioner. The article is then immersed in a conventional chromic acid-sulfuric acid etching bath to roughen the article surface by etching the butadiene, the amount of ABS being so available having been increased by application of the conditioner. The bath is maintained at a temperature of about 158°–162° F. to treat the article for 2 to 8 minutes. The article is then rinsed in tap or deionized water to remove residual traces of the acidic etching bath. The article is then placed in a neutralizing bath maintained at about 100°–120° F. for a time of about 0.5 to about 2 minutes to remove residual traces of the hexavalent chromium ions from the etching bath. The article is then rinsed in tap or deionized water to remove residual traces of the neutralizing bath. The article is thereafter treated with a conventional tin-palladium catalyst at a concentration of about 40–45 ppm for about 2–4 minutes at a temperature of about 80°–90° F. and then rinsed to remove residual traces of the catalyst. The article is thereafter treated with a conventional accelerator for about 1–3 minutes to remove the tin of the tin-palladium catalst thereby enhancing the catalytic effect of the palladium, and then again rinsed in tap or deionized water. The article is then plated with a copper strike in a conventional electroless bath and then conventionally, electrochemically plated with copper or nickel.

It will be recognized by those skilled in the art that a conventional ABS plating cycle has been applied to the ABS-modified polycarbonate plastic substrate. However, this is only possible after the substrate has been uniquely preconditioned in the chlorinated organic solvent conditioner of this invention which makes the electroplating possible.

Illustrative examples of automotive trim parts which may be formed from the method of this invention are as follows. Automobile bumpers are typically mounted to the front and rear fascias of the automobile and located in a direct impact area. A bumper provides both decorative ornamentation and impact protection for the vehicle in the event of a collision. Currently, bumpers are typically manufactured from plated stainless steel which is heavy and expensive to provide. If formed from plated ABS-modified polycarbonate plastic according to the method of this invention, the resulting bumper is lightweight, relatively inexpensive to provide, corrosion resistant, similarly resistant to impact as stainless steel and has far greater design flexibility. Other automotive trim elements which may be formed using this method are body side moldings, lower body claddings, wheel covers and grilles, as well as other components. In addition, other non-automotive articles that have a decorative purpose but which also require impact resistance, may be formed according to this method.

With this method, the various trim members may also be injection molded as a single piece rather than in multiple pieces as is presently required. This is possible because with this method, the trim article may be both plated and painted. The trim article may be both plated and painted by first resist painting that portion of the article that is to be left unplated. This is done before initiating the method of this invention, in particular the organic conditioning step. The resist painted area is not conditioned and does not become plated during the steps of this method, even though the remaining, unpainted area does become plated. Once the areas not having the resist paint are plated, the resist painted area may be painted with the desired finish. Because the trim article may be both painted and plated, a one-piece rather than a multiple-piece component is possible, thereby also significantly enhancing the design flexibility and cost savings.

This novel method for electroplating an impact resistant ABS-modified polycarbonate polymer blend provides an efficient, cost-effective means for manufacturing lightweight plated plastic articles having superior metal plate to plastic substrate bond adhesion. While our invention has been described in terms of a preferred embodiment, it is apparent that reasonable variations or modifications could be adopted by one skilled in the art without departing from the spirit of this invention, such as by modifying the processing parameters or by using a different halogenated organic solvent conditioner. Accordingly, the scope of our invention is to be limited only by the following claims.

What is claimed is:

1. A method electroplating an impact resistance plastic article comprising the following steps:

providing a substrate of a polycarbonate which has been modified with between about 15 percent and about 50 percent by weight of acrylonitrile-butadiene-styrene;

conditioning a surface of said substrate with a halogenated organic solvent conditioner at a temperature no higher than 120° F. and for a duration sufficient to increase the amount of exposed acrylonitrile-butadiene-styrene at said conditioned surface, said organic solvent conditioner consisting of between about 5 and about 25 volume percent of a halogenated hydrocarbon in an aqueous medium, said halogenated hydrocarbon chosen from the group consisting of alcohols, ketones, and ethers;

rinsing said conditioned surface of said substrate in water;

etching said conditioned surface of said substrate with an acidic solution at a temperature of approximately 140° F. to 180° F. and for a duration of up to ten (10) minutes sufficient to roughen said conditioned surface; wherein said acidic solution is made by providing an aqueous sulfuric acid solution having a normality of about 10.5 to about 11.0 and then adding to each gallon of solution about 3.5 to about 4.0 pounds of chromic acid;

rinsing said conditioned and etched surface of said substrate in water;

neutralizing said conditioned and etched surface of said substrate in a neutralizing bath maintained at about 100°–120° F. for a time of about 0.5 to about 2.0 minutes; rinsing said conditioned and etched surface of said substrate in water;

catalyzing said conditioned and etched surface of said substrate in a solution comprising between 20 to about 50 PPM palladium at between 80° F. to 90° F. for about 2 to 4 minutes;

accelerating said catalyzed surface of said substrate in a solution comprising sulfuric acid and complexers to neutralize the effect of contaminates, at a temperature of between 110° F. to 140° F. for approximately one-half (½) to 3 minutes;

electrolessly depositing a layer of a metal strike on said catalyzed and accelerated surface of said substrate; and electrochemically plating a metal onto said layer of said metal strike.

2. A method for electroplating a plastic article as recited in claim 1 wherein said halogenated organic solvent conditioner comprises about 25 percent by volume of 1-3-dichloro-2-propanol in an aqueous medium and said conditioning step occurs at a temperature of about 95° F. for a duration not longer than about 4 minutes.

3. A method for electroplating a plastic article as recited in claim 1 wherein said etching step occurs at a temperature of about 160° F. and for a duration of about 2 to 8 minutes.

4. A method for electroplating a plastic article as recited in claim 1 wherein said plastic is a polycarbonate modified with about 40 percent by weight of acrylonitrile-butadiene-styrene and said organic solvent conditioner is 1-3-dichloro-2-propanol.

5. An electroplated impact-resistant acrylonitrile-butadiene-styrene modified polycarbonate plastic article produced according to the method of claim 1.

* * * * *

UNITED STATES PATENT AND TRADEMARK OFFICE
CERTIFICATE OF CORRECTION

PATENT NO. : 5,846,665
DATED : December 8, 1998
INVENTOR(S) : Timmer et al.

It is certified that error appears in the above-identified patent and that said Letters Patent is hereby corrected as shown below:

Column 5, line 31, after "percent by" kindly insert ----volume ----; same line after "10 to 12" kindly delete "volume".

Column 7, line 30, kindly delete "mthod" and insert ----method----.

Column 8, line 25, kindly delete "catalst" and insert ----catalyst----.

Column 8, line 60, after "method" kindly delete the comma " , ".

Column 9, line 19, after "method" kindly insert ----for----; same line kindly delete "resistance" and insert ----resistant----.

Column 10, line 8, after "minutes;" kindly start new paragraph to indicate separate step.

Signed and Sealed this

Twenty-first Day of December, 1999

*Attest:*

Q. TODD DICKINSON

*Attesting Officer*  *Acting Commissioner of Patents and Trademarks*